United States Patent
Suzuki et al.

(10) Patent No.: US 9,054,714 B2
(45) Date of Patent: Jun. 9, 2015

(54) CLOCK RECOVERY CIRCUIT AND CLOCK AND DATA RECOVERY CIRCUIT

(71) Applicant: FUJITSU LIMITED, Kawasaki-shi, Kanagawa (JP)

(72) Inventors: Kosuke Suzuki, Ota (JP); Hirotaka Tamura, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/072,317

(22) Filed: Nov. 5, 2013

(65) Prior Publication Data

US 2014/0210530 A1    Jul. 31, 2014

(30) Foreign Application Priority Data

Jan. 31, 2013   (JP) ................................. 2013-017150

(51) Int. Cl.
*H03L 7/06*   (2006.01)
*H03L 7/08*   (2006.01)

(52) U.S. Cl.
CPC ................................... *H03L 7/0802* (2013.01)

(58) Field of Classification Search
None
See application file for complete search history.

(56) References Cited

U.S. PATENT DOCUMENTS

| | | | | |
|---|---|---|---|---|
| 5,052,022 A * | 9/1991 | Nishita et al. | ................. | 375/215 |
| 6,489,851 B1 * | 12/2002 | Miyada et al. | ................. | 331/11 |
| 6,621,312 B2 * | 9/2003 | Tang et al. | ................. | 327/156 |
| 6,888,412 B2 * | 5/2005 | Kim et al. | ................. | 331/1 A |
| 2004/0001600 A1 * | 1/2004 | Kim et al. | ................. | 381/100 |
| 2011/0291715 A1 * | 12/2011 | Sogawa et al. | ................. | 327/157 |
| 2014/0118040 A1 * | 5/2014 | Nakayama et al. | ........... | 327/157 |

FOREIGN PATENT DOCUMENTS

JP             10-126400 A        5/1998

* cited by examiner

*Primary Examiner* — Lincoln Donovan
*Assistant Examiner* — Khareem E Almo
(74) *Attorney, Agent, or Firm* — Arent Fox LLP

(57) ABSTRACT

A clock recovery circuit includes: a phase comparison circuit to compare a data signal and a recovered clock; a charge pump circuit to output a current based on a phase difference signal; a loop filter to convert the current into a control voltage; an oscillation circuit to generate a first sine-wave clock having a frequency corresponding to the control voltage and a second sine-wave clock having a phase obtained by shifting a phase of the first sine-wave clock by 90 degrees; and a clock selector to select, as the recovered clock, the first sine-wave clock or the second sine-wave clock, a selected clock having a voltage difference between a voltage at a transition of the data signal and a center of an amplitude is larger than a voltage difference between a voltage of a non-selected clock at the time and a center of an amplitude of the non-selected clock.

7 Claims, 7 Drawing Sheets

FIG. 4

|     | SIGA | SIGB | SIGC |
|-----|------|------|------|
| (A) | 0    | 0    | 0    |
| (B) | 0    | 1    | 1    |
| (C) | 1    | 0    | 1    |
| (D) | 1    | 1    | 0    |

1

CLOCK RECOVERY CIRCUIT AND CLOCK AND DATA RECOVERY CIRCUIT

CROSS-REFERENCE TO RELATED APPLICATION

This application is based upon and claims the benefit of priority of the prior Japanese Patent Application No. 2013-017150, filed on Jan. 31, 2013, the entire contents of which are incorporated herein by reference.

FIELD

Embodiments discussed herein are related to a clock recovery circuit and a clock and data recovery circuit.

BACKGROUND

The data rate of signals that are transmitted and received inside and outside apparatuses has increased. Accordingly, a clock and data recovery (CDR) circuit that recovers a clock and data from a received data signal is used on a receiver side.

A related technique is described in Japanese Laid-open Patent Publication No. 10-126400.

SUMMARY

According to one aspect of the embodiments, a clock recovery circuit includes: a phase comparison circuit configured to compare a phase of a data signal and a phase of a recovered clock and output a phase difference signal indicating a phase difference; a charge pump circuit configured to output a current based on the phase difference signal; a loop filter configured to smooth the current output by the charge pump circuit and convert the smoothed current into a control voltage; an oscillation circuit configured to generate a first sine-wave clock having a frequency corresponding to the control voltage and a second sine-wave clock having a phase obtained by shifting a phase of the first sine-wave clock by 90 degrees; and a clock selector configured to select, as the recovered clock, one of the first sine-wave clock and the second sine-wave clock, a selected clock having a voltage difference between a voltage of the selected clock at a time of a transition of the data signal and a center of an amplitude of the selected clock is larger than a voltage difference between a voltage of a non-selected clock at the time and a center of an amplitude of the non-selected clock.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 4 illustrates an example of clock selection logic.

DESCRIPTION OF EMBODIMENTS

A CDR circuit determines the phase relationship between a clock recovered by a receiver and received data, and locks the timing of the clock. The power that is consumed along a clock path or the like decreases with decreasing frequency of the clock. In a half-rate CDR circuit that is a CDR circuit in which a frequency of a clock thereof is half a data rate, for example, in the case where the data rate is 10 gigabits per second (Gbps), the frequency of the clock may be 5 GHz. In a phase locked loop (PLL) circuit, a clock signal having a frequency that is half a bit rate is extracted from an input non-return to zero (NRZ) signal, and the operation frequency of a phase comparison circuit is reduced to half, thereby reducing power consumption.

In the case of transmission and reception of data between a transmitter and a receiver, an idle time period over which the transmitter does not transmit data is present. For example, in order to save electric power, the receiver is controlled so as to be in an off-state over the idle time period over which no data is transmitted from the transmitter and so as to return to an on-state (an operation state) when data is transmitted again from the transmitter. When the receiver enters the on-state, a CDR circuit locks the timing of a clock following to the timing of a data signal again. In the case of a half-rate CDR circuit, when the receiver enters the on-state, a time period taken to lock the timing of a clock and the timing of data is longer than that in the case of a full-rate CDR circuit.

Figure 1:
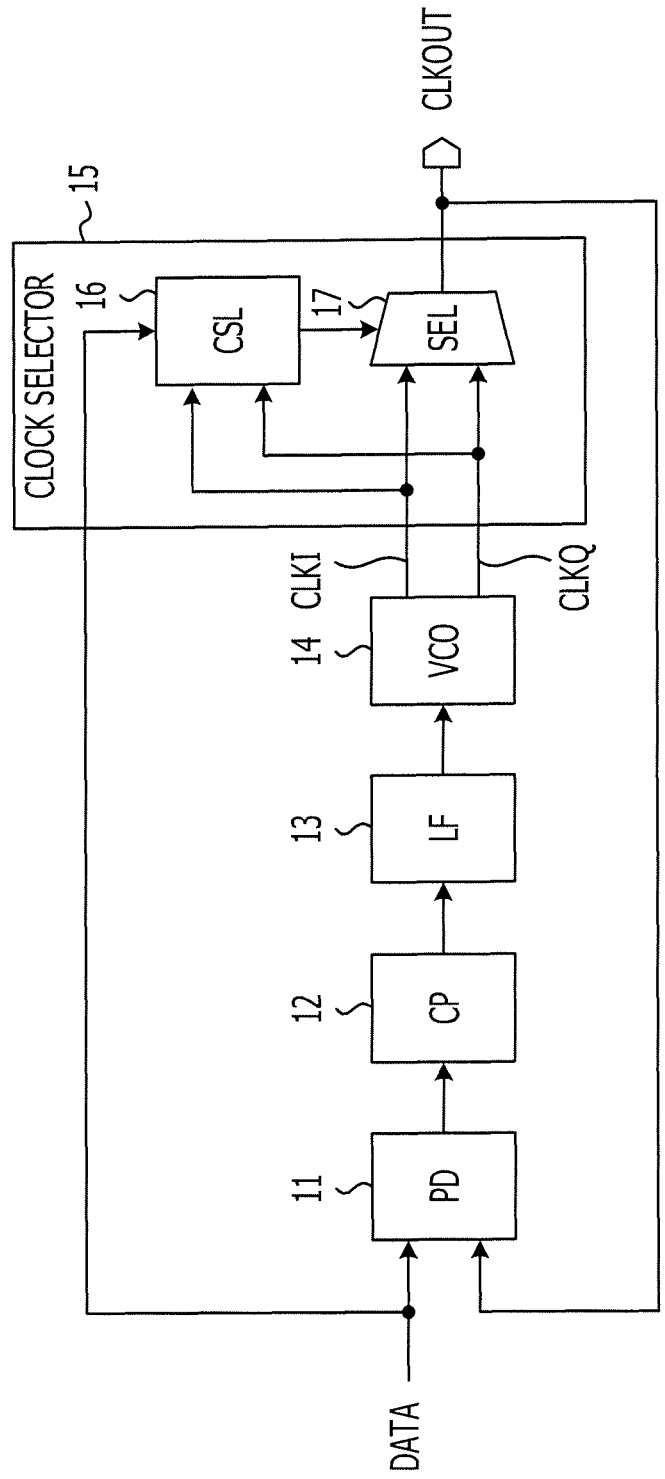
FIG. 1 illustrates an example of a clock recovery circuit.

FIG. 1 illustrates an example of a clock recovery circuit. A clock recovery circuit 10 may be a half-rate PLL CDR circuit in which the frequency of a clock of a receiver is half the data rate of a signal that is transmitted and received. The half-rate CDR circuit may be applied to a receiver that is included in an input and output (I/O) unit configured to perform data transfer at a high speed, for example, in communication inside an LSI chip, short distance communication between chips on the same board, or medium and long distance communication between daughter cards or servers via a backplane.

The clock recovery circuit 10 includes a phase comparison circuit (PD) 11, a charge pump circuit (CP) 12, a loop filter (LF) 13, a voltage-control oscillation circuit (VCO) 14, and a clock selector 15. The phase comparison circuit 11 compares the phase of a received data signal DATA and the phase of a recovered clock CLKOUT, and outputs a phase difference signal indicating a phase difference. The charge pump circuit 12 outputs, to the loop filter 13, a charge pump current that depends on the phase difference signal output from the phase comparison circuit 11. The charge pump current is supplied from the charge pump circuit 12 to the loop filter 13. The loop filter 13 smoothes the supplied charge pump current, and converts the smoothed charge pump current into a control voltage of the voltage-control oscillation circuit 14.

The voltage-control oscillation circuit 14 outputs a clock (an oscillation signal) having a frequency that depends on the control voltage. The voltage-control oscillation circuit 14 may output a first clock CLKI that is a 0-degree clock and a second clock CLKQ that is a 90-degree clock having a phase which is 90 degrees different from the phase of the first clock CLKI. The first clock CLKI and the second clock CLKQ that are output by the voltage-control oscillation circuit 14 may be sine-wave clocks having substantially the same frequency. Although the voltage-control oscillation circuit 14 is configured to output sine-wave clocks having two phases that are the first clock CLKI and the second clock CLKQ, the voltage-control oscillation circuit 14 may be configured to further output a 180-degree clock or a 270-degree clock.

In the case where the phase of the recovered clock CLKOUT is ahead of the phase of the data signal DATA, the phase comparison circuit 11, the charge pump circuit 12, and the loop filter 13 control the control voltage of the voltage-control oscillation circuit 14 so that the frequencies of the clocks output by the voltage-control oscillation circuit 14 reduce. In the case where the phase of the recovered clock CLKOUT is behind the phase of the data signal DATA, the phase comparison circuit 11, the charge pump circuit 12, and the loop filter 13 control the control voltage of the voltage-control oscillation circuit 14 so that the frequencies of the clocks output by the voltage-control oscillation circuit 14 increase.

The clock selector 15 may be provided on the output side of the clock recovery circuit 10, for example, as a next-stage circuit that is next to the voltage-control oscillation circuit 14. The clock selector 15 selects one of the first clock CLKI and the second clock CLKQ which are output by the voltage-control oscillation circuit 14, and outputs the selected clock as the recovered clock CLKOUT. The recovered clock CLKOUT output by the clock selector 15 is also output to the outside of the clock recovery circuit 10. The clock selector 15 includes a clock-selection control circuit (CSL) 16 and a selection circuit (SEL) 17.

The clock selector 15 detects the signal level of the recovered clock CLKOUT at a rising edge or falling edge of the data signal DATA, and compares the voltage of the first clock CLKI and the voltage of the second clock CLKQ. The clock selector 15 outputs, based on a result of detection and comparison, a selection control signal to the selection circuit 17.

The first clock CLKI and the second clock CLKQ which are output from the voltage-control oscillation circuit 14 are input to the selection circuit 17, and the selection control signal output from the clock selector 15 is input to the selection circuit 17. In accordance with the selection control signal, the selection circuit 17 selects and outputs the first clock CLKI or the second clock CLKQ as the recovered clock CLKOUT.

Figure 2A:
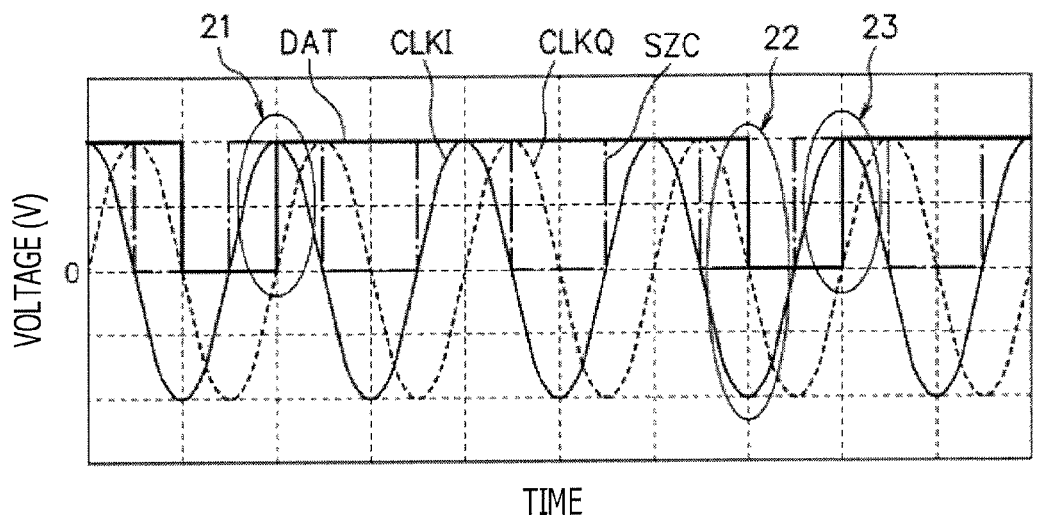
FIGS. 2A to 2C illustrate an example of changes in signals.
Figure 2B:
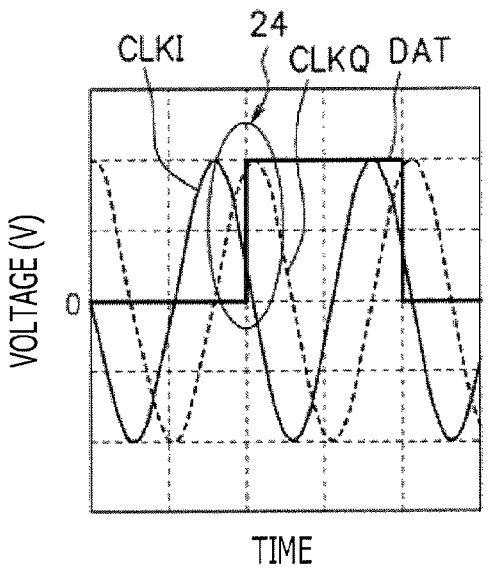
Figure 2C:
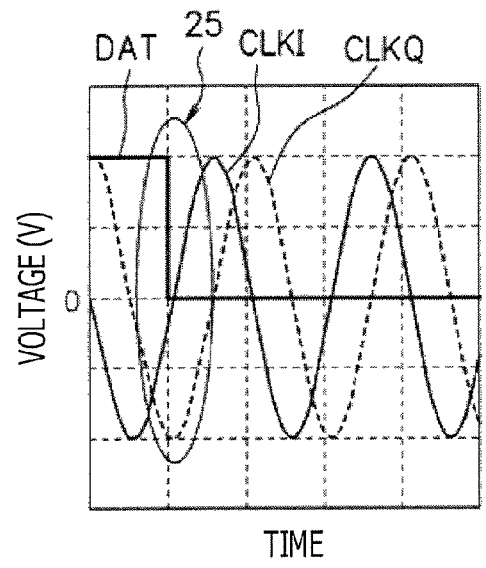

FIGS. 2A to 2C are an example of a change in a signal. In the half-rate CDR circuit, when entering a lock-state, as illustrated in FIG. 2A, a timing at which the half-rate clock reaches a peak thereof, for example, a timing at which the half-rate clock reaches the maximum value or minimum value thereof, and a timing at which transition of data occurs coincide with each other. In FIG. 2A, CLKI illustrated by a solid line represents the first clock that is a 0-degree clock, and CLKQ illustrated by the broken line represents the second clock that is a 90-degree clock. DAT illustrated by a solid line represents received data, and SZC illustrated by an alternate long and short dash line represents a sampling clock for data based on the first clock CLKI. The signal level of the sampling clock SZC changes at zero-crossing points of the first clock CLKI.

In FIG. 2A, a state in which the timing of the first clock CLKI and the timing of the data DAT are locked is illustrated. For example, timings 21 and 23 at which the first clock CLKI reaches the maximum value thereof and edges of the data DAT occur substantially contemporaneously. A timing 22 at which the first clock CLKI reaches the minimum value thereof and an edge of the data DAT occur substantially contemporaneously.

As described above, in the half-rate CDR circuit, when entering the lock-state, a timing at which the half-rate clock reaches a peak thereof coincides with a timing at which transition of the data occurs. Accordingly, at an edge of the data, a clock whose voltage is closer to a peak value thereof than the voltage of the other clock has a phase closer to a phase at which a clock is to be locked than the phase of the other clock. Before being locked, the clock-selection control circuit 16 of the clock selector 15 compares, at an edge of the data, the signal voltage of the first clock CLKI and the signal voltage of the second clock CLKQ. A clock in which the absolute value of the voltage difference between a voltage of the clock at the edge of the data and a common potential of the clock is larger than the absolute value of the voltage difference between a voltage of the other clock at the edge of the data and a common potential of the other clock is selected as a clock that is a target for lock control. The common potential may be a potential at the center of an amplitude of a sine-wave clock, and may be an average of the maximum value and minimum value of the amplitude. For example, a clock in which the absolute value of the voltage difference between a voltage of the clock at an edge of the data (at a time at which transition of the data occurs) and the common potential of the clock is larger than the absolute value of the voltage difference between the voltage of the other clock at the edge of the data and the common potential of the other clock is a clock in which the voltage difference between the voltage of the clock at the edge of the data (at the time at which transition of the data occurs) and the center of the amplitude of the clock is larger than the voltage difference between the voltage of the other clock at the edge of the data and the center of the amplitude of the other clock. With this control, in the case of the CDR circuit, the time period taken to lock the timing of a clock and the timing of data may be reduced.

As illustrated in FIG. 2B, at a timing 24 at which the data DAT has an rising edge, when the absolute value of the voltage difference between a voltage of the second clock CLKQ and the common potential of the second clock CLKQ is larger than the absolute value of the voltage difference between a voltage of the first clock CLKI and the common potential of the first clock CLKI, the clock selector 15 selects and outputs the second clock CLKQ as the recovered clock CLKOUT. As illustrated in FIG. 2C, at a timing 25 at which the data DAT has a falling edge, when the absolute value of the voltage difference between a voltage of the second clock CLKQ and the common potential of the second clock CLKQ is larger than the absolute value of the voltage difference between a voltage of the first clock CLKI and the common potential of the first clock CLKI, the clock selector 15 selects and outputs the second clock CLKQ as the recovered clock CLKOUT. Here, as illustrated in FIGS. 2B and 2C, when the common potential of each of the first clock CLKI and the second clock CLKQ is the zero potential, control may be performed so that, from between the first clock CLKI and the second clock CLKQ, a clock in which the absolute value of a voltage of the clock at an edge of the data DAT is larger than the absolute value of a voltage of the other clock at the edge of the data DAT may be selected and output as the recovered clock CLKOUT.

Figure 3:
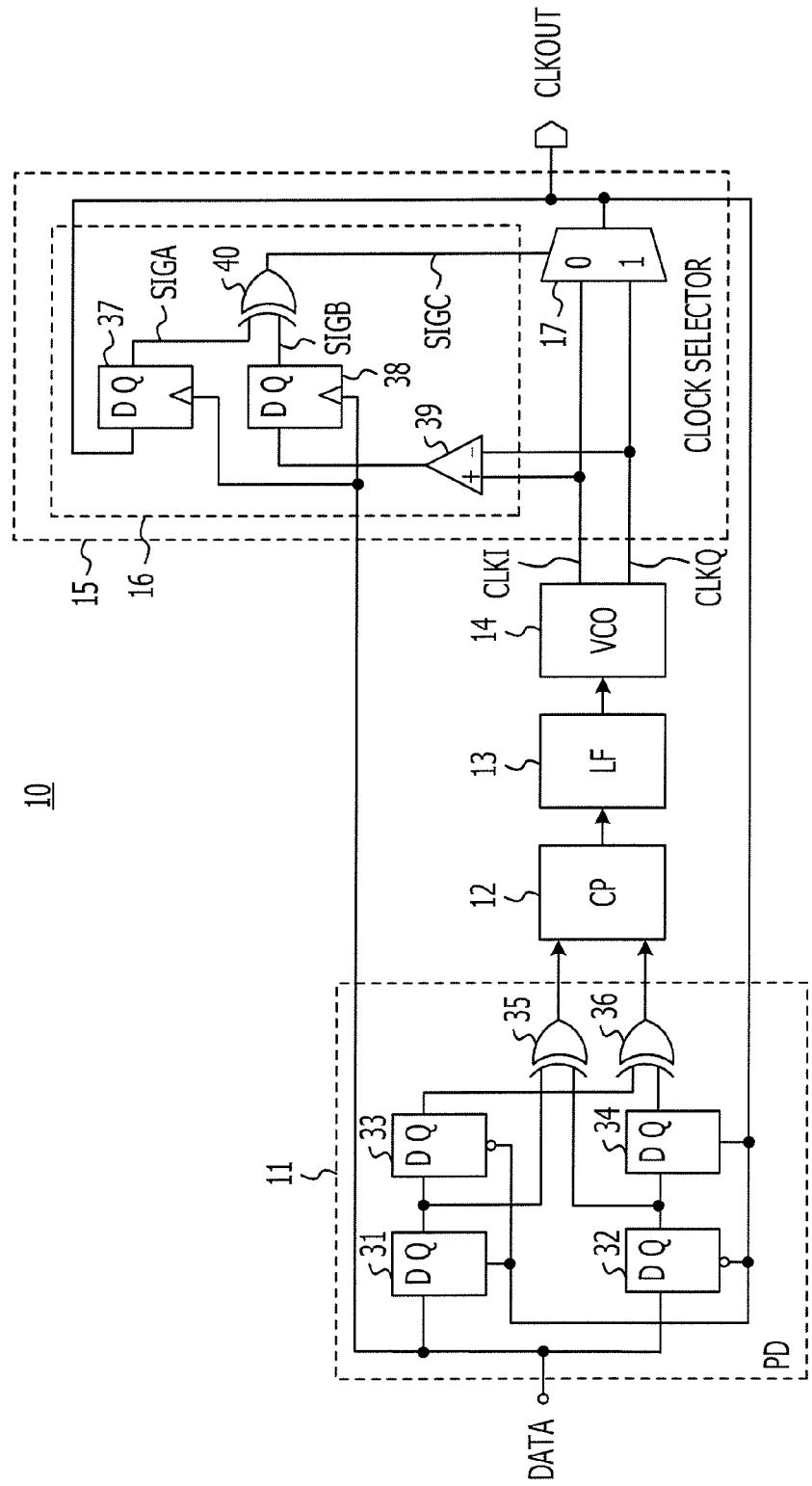
FIG. 3 illustrates an example of a clock recovery circuit.

FIG. 3 illustrates an example of a clock recovery circuit. The clock recovery circuit illustrated in FIG. 3 may correspond to the phase comparison circuit 11 and the clock-selection control circuit 16 illustrated in FIG. 1. In FIG. 3, elements that are substantially the same as or similar to the elements illustrated in FIG. 1 may be denoted by the same reference numerals, and a description thereof may be omitted or reduced. The phase comparison circuit 11 and the clock-selection control circuit 16 illustrated in FIG. 3 are examples.

The phase comparison circuit 11 may be a half-rate Hogge phase comparison circuit. The phase comparison circuit 11 includes four latches that are latches 31, 32, 33, and 34 and two exclusive-OR arithmetic circuits (EXOR circuits) that are EXOR circuits 35 and 36.

The received data signal DATA is input to inputs D of the latches 31 and 32. Outputs Q of the latches 31 and 32 are input to inputs D of the latches 33 and 34, respectively. The latches 31 and 34 are driven by the recovered clock CLKOUT. When the level of the recovered clock CLKOUT is at a high level, the inputs D of the latches 31 and 34 are transferred to the outputs Q thereof, and, when the level of the recovered clock CLKOUT is at a low level, the outputs Q thereof are held. The latches 32 and 33 are driven by a signal obtained by inverting the recovered clock CLKOUT. When the level of the recovered clock CLKOUT is at a low level, the inputs D of the latches 32 and 33 are transferred to the outputs Q thereof, and, when the level of the recovered clock CLKOUT is at a high level, the outputs Q thereof are held. The outputs Q of the latches 31 and 32 are input to the EXOR circuit 35, and the EXOR circuit 35 outputs a result of an arithmetic operation to the charge pump circuit 12. The outputs Q of the latches 33 and 34 are input to the EXOR circuit 36, and the EXOR circuit 36 outputs a result of an arithmetic operation to the charge pump circuit 12.

For example, in the half-rate Hogge phase comparison circuit 11 illustrated in FIG. 3, over a time period that starts when transition of the data signal DATA occurs and that depends on the phase difference between the phase of the data signal DATA and the phase of the recovered clock CLKOUT, the level of the output of the EXOR circuit 35 is at a high level. When transition of the data signal DATA occurs, the level of the output of the EXOR circuit 36 becomes high. In FIG. 3, the phase comparison circuit 11 that is a linear phase comparison circuit as with the phase comparison circuit 11 (1×PD) which samples one point for one piece of data (data 1UI) is illustrated. However, a phase comparison circuit using another scheme may be applied.

The clock-selection control circuit 16 includes two flip flops that are flip flops 37 and 38, a comparator 39, and an EXOR circuit 40. The recovered clock CLKOUT is input to an input D of the flip flop 37, and the output of the comparator 39 is input to an input D of the flip flop 38. The flip flops 37 and 38 sample (take) the inputs D thereof at a rising edge or falling edge of the received data signal DATA, and output a signal SIGA and a signal SIGB, respectively, from outputs Q thereof.

The comparator 39 compares the voltage of the first clock CLKI and the voltage of the second clock CLKQ that are input to the comparator 39. When the voltage of the first clock CLKI is higher than the voltage of the second clock CLKQ, the level of the output of the comparator 39 is at a high level, and, when the voltage of the first clock CLKI is lower than the voltage of the second clock CLKQ, the level of the output of the comparator 39 is at a low level. The signal SIGA output from the output Q of the flip flop 37 and the signal SIGB output from the output Q of the flip flop 38 are input to the EXOR circuit 40. The EXOR circuit 40 outputs a result of an arithmetic operation as a selection control signal SIGC. The selection circuit 17 selects and outputs the first clock CLKI or the second clock CLKQ in accordance with the selection control signal SIGC.

It is assumed that, immediately after an operation of returning from an off-state to an on-state has started, the first clock CLKI is selected and output as the recovered clock CLKOUT. The signal SIGA output from the flip flop 37 illustrated in FIG. 3 indicates the signal level of the recovered clock CLKOUT that is sampled at an edge of the data signal DATA. At an edge of the data signal DATA, when the level of the recovered clock CLKOUT is at a low level, the level of the signal SIGA becomes "0" (a low level), and, when the level of the recovered clock CLKOUT is at a high level, the level of the signal SIGA becomes "1" (a high level). The signal SIGB output from the flip flop 38 indicates whether or not, at an edge of the data signal DATA, the voltage of the first clock CLKI is higher than the voltage of the second clock CLKQ. At an edge of the data signal DATA, when the voltage of the first clock CLKI is higher than the voltage of the second clock CLKQ, the level of the signal SIGB becomes "1" (a high level), and, when the voltage of the first clock CLKI is lower than the voltage of the second clock CLKQ, the level of the signal SIGB becomes "0" (a low level).

FIG. 4 and FIGS. 5A to 5D illustrate an example of clock selection logic. For example, the case where the signal SIGA is "0" and the signal SIGB is "0" (row (A) of FIG. 4) may correspond to a state illustrated in FIG. 5A. For example, at an edge of the data signal DATA, the level of the first clock CLKI as the recovered clock CLKOUT is at a low level, and the voltage of the first clock CLKI is lower than the voltage of the second clock CLKQ. The phase of the first clock CLKI is closer to a phase at which a clock is to be locked than the phase of the second clock CLKQ. Thus, when the first clock CLKI is selected, the first clock CLKI promptly falls into a lock-state. In this case, the selection control signal SIGC output from the EXOR circuit 40 becomes "0", and, in accordance with the selection control signal SIGC, the selection circuit 17 outputs the first clock CLKI as the recovered clock CLKOUT.

Figure 4:
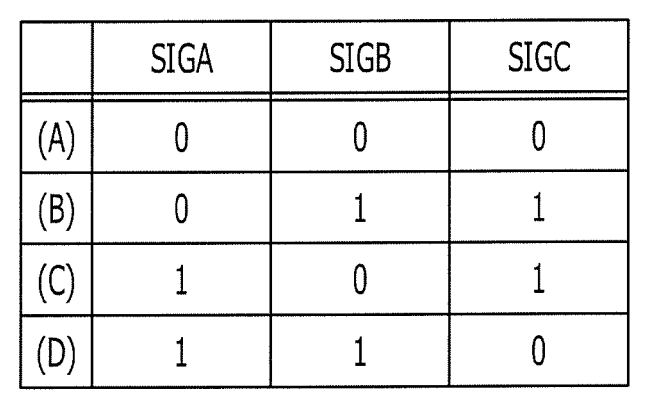
Figure 5A:
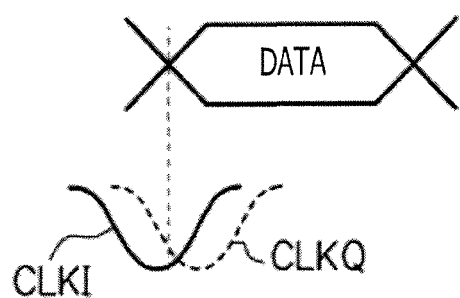
FIGS. 5A to 5D illustrate an example of clock selection logic.
Figure 5B:
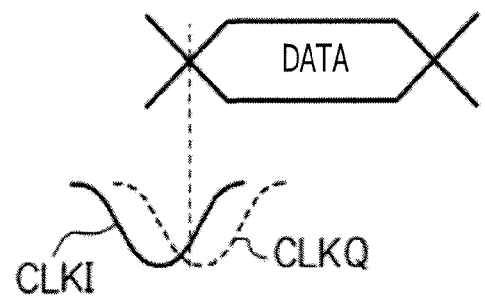

The case where the signal SIGA is "0" and the signal SIGB is "1" (row (B) of FIG. 4) may correspond to a state illustrated in FIG. 5B. For example, at an edge of the data signal DATA, the level of the first clock CLKI as the recovered clock CLKOUT is at a low level, and the voltage of the first clock CLKI is higher than the voltage of the second clock CLKQ. The phase of the second clock CLKQ is closer to a phase at which a clock is to be locked than the phase of the first clock CLKI. Thus, when the second clock CLKQ is selected, the second clock CLKQ falls into a lock-state. In this case, the selection control signal SIGC output from the EXOR circuit 40 becomes "1". In accordance with the selection control signal SIGC, the selection circuit 17 switches the clock that is output as the recovered clock CLKOUT from the first clock CLKI to the second clock CLKQ, and outputs the second clock CLKQ.

Figure 5C:
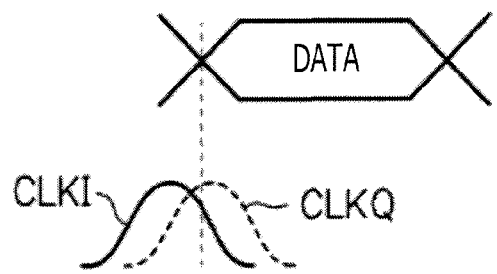

The case where the signal SIGA is "1" and the signal SIGB is "0" (row (C) of FIG. 4) may correspond to a state illustrated in FIG. 5C. For example, at an edge of the data signal DATA, the level of the first clock CLKI as the recovered clock CLKOUT is at a high level, and the voltage of the first clock CLKI is lower than the voltage of the second clock CLKQ. The phase of the second clock CLKQ is closer to a phase at which a clock is to be locked than the phase of the first clock CLKI. Thus, when the second clock CLKQ is selected, the second clock CLKQ may promptly fall into a lock-state. In this case, the selection control signal SIGC output from the EXOR circuit 40 becomes "1". In accordance with the selection control signal SIGC, the selection circuit 17 switches the clock that is output as the recovered clock CLKOUT from the first clock CLKI to the second clock CLKQ, and outputs the second clock CLKQ.

Figure 5D:
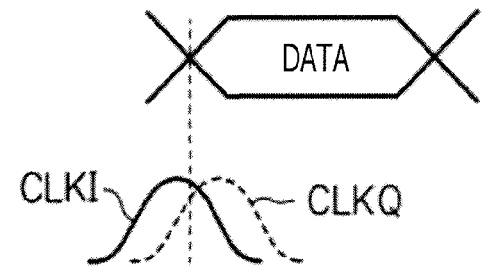

The case where the signal SIGA is "1" and the signal SIGB is "1" (row (D) of FIG. 4) may correspond to a state illustrated in FIG. 5D. For example, at an edge of the data signal DATA, the level of the first clock CLKI as the recovered clock CLKOUT is at a high level, and the voltage of the first clock CLKI is higher than the voltage of the second clock CLKQ. The phase of the first clock CLKI is closer to a phase at which a clock is to be locked than the phase of the second clock CLKQ. Thus, when the first clock CLKI is selected, the first clock CLKI may promptly fall into a lock-state. In this case, the selection control signal SIGC output from the EXOR circuit 40 becomes "0", and, in accordance with the selection control signal SIGC, the selection circuit 17 outputs the first clock CLKI as the recovered clock CLKOUT.

In the case where the CDR circuit enters an operation state, before the timing of the recovered clock CLKOUT and the timing of the data signal DATA are locked, the clock-selection control circuit 16 of the clock selector 15 outputs the selection control signal SIGC in accordance with the clock selection logic illustrated in FIG. 4. Thus, the selection circuit 17 of the clock selector 15 selects, from between the first clock CLKI and the second clock CLKQ, a clock having a phase closer to a phase at which a clock is to be locked than the phase of the other clock, and outputs the selected clock as the recovered clock CLKOUT. After the timing of the recovered clock CLKOUT and the timing of the data signal DATA have been locked, selection control of the clock selector 15 stops, and the operation of the half-rate CDR circuit starts. For example, an operation of a typical half-rate CDR circuit may start.

In the clock recovery circuit 10 that is a half-rate CDR circuit, the voltage-control oscillation circuit 14 generates the first clock CLKI and the second clock CLKQ that have phases which are 90 degrees different from each other. At an edge of the received data signal DATA, the present signal level of the recovered clock CLKOUT is detected. Additionally, the voltages of the two clocks that are the first clock CLKI and the second clock CLKQ are compared with each other, and, in accordance with a result of comparison, one of the two clocks that are the first clock CLKI and the second clock CLKQ is selected. Thus, from between the first clock CLKI and the second clock CLKQ that have phases which are 90 degrees different from each other, a clock having a phase closer to a phase at which a clock is to be locked than the phase of the other clock is selected and output as the recovered clock CLKOUT, and the selected clock promptly falls into a lock-state. The time period taken to lock the timing of a clock may be reduced.

Figure 6:
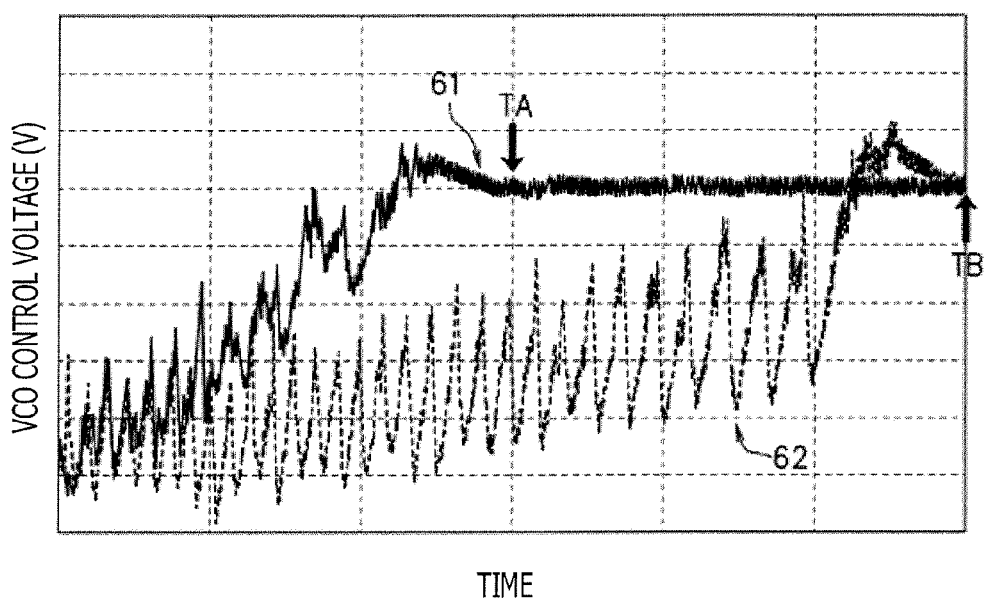
FIG. 6 illustrates an example of a time period taken to lock a timing of a clock.

FIG. 6 illustrates an example of a time period taken to lock a timing of a clock. For example, in the clock recovery circuit 10 illustrated in FIG. 1, as a waveform 61 indicates, the time period taken to lock the timing of a clock is a time period TA. In another clock recovery circuit, as a waveform 62 indicates, the time period taken to lock the timing of a clock may be a time period TB. In the case of the half-rate CDR circuit, the time period taken to lock the timing of a clock and the timing of data may be reduced to about half.

Figure 7:
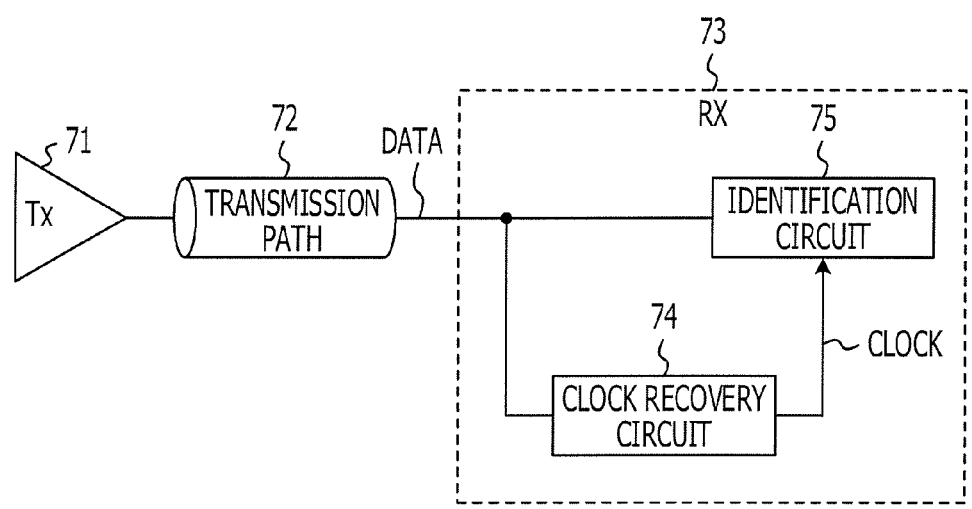
FIG. 7 illustrates an example of a clock and data recovery circuit.

FIG. 7 illustrates an example of a clock and data recovery circuit. A CDR circuit 73 illustrated in FIG. 7 may be a half-rate CDR circuit. The CDR circuit 73 receives, via a transmission path 72, a data signal DATA transmitted from a transmitter 71. A clock recovery circuit 74 may be the clock recovery circuit illustrated in FIG. 1 or 3. The clock recovery circuit 74 recovers, from the received data signal DATA, a clock CLOCK having a frequency that is half the data rate of the data signal DATA. An identification circuit 75 performs identification of the data signal DATA using the recovered clock CLOCK that is recovered by the clock recovery circuit 74, thereby recovering data. For example, the identification circuit 75 samples the data signal DATA using a sampling clock based on the recovered clock CLOCK, thereby recovering data.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A clock recovery circuit, comprising:
   a phase comparison circuit configured to compare and output a phase difference signal between a data signal and a recovered clock;
   a charge pump circuit configured to output a current based on the phase difference signal;
   a loop filter configured to smooth the current and convert the smoothed current into a control voltage;
   an oscillation circuit configured to generate a first sine-wave clock having a frequency corresponding to the control voltage and a second sine-wave clock having a phase obtained by shifting a phase of the first sine-wave clock by 90 degrees; and
   a clock selector configured to select, as the recovered clock, one of the first sine-wave clock and the second sine-wave clock, a selected clock having a first voltage difference between a voltage of the selected clock at a time of a transition of the data signal and a center of an amplitude of the selected clock being larger than a second voltage difference between a voltage of a non-selected clock at the time and a center of an amplitude of the non-selected clock,
   wherein the clock selector includes:
      a selection control circuit configured to compare a voltage of the first sine-wave clock and a voltage of the second sine-wave clock when the transition of the data signal occurs, and output a selection control signal indicating the recovered clock; and
      a selection circuit configured to select the first sine-wave clock or the second sine-wave clock based on the selection control signal,
   wherein the selection control circuit includes:
      a comparator configured to compare the voltage of the first sine-wave clock and the voltage of the second sine-wave clock;
      a first flip flop configured to sample an output of the comparator at an edge of the data signal; a second flip flop configured to sample the recovered clock at the edge of the data signal; and
      an arithmetic circuit configured to perform an exclusive-OR operation on an output of the first flip flop and an output of the second flip flop to generate the selection control signal.

2. The clock recovery circuit according to claim 1, wherein the voltage of the recovered clock is obtained at a rising edge or a falling edge of the data signal, and the voltage of the non-selected clock is obtained at a rising edge or a falling edge of the data signal.

3. The clock recovery circuit according to claim 1, wherein the recovered clock is recovered from the data signal and has a frequency that is half a data rate.

4. The clock recovery circuit according to claim 1, wherein the selection control circuit includes:

a comparator configured to compare the voltage of the first sine-wave clock and the voltage of the second sine-wave clock; and a detector configured to detect a signal level of the recovered clock.

5. A clock and data recovery circuit, comprising:

a clock recovery circuit configured to recover a clock from a data signal; and an identification circuit configured to perform an identification of the data signal using the recovered clock, wherein the clock recovery circuit includes:

a phase comparison circuit configured to compare and output a phase difference signal indicating a phase difference between a data signal and the recovered clock;

a charge pump circuit configured to output a current based on the phase difference signal;

a loop filter configured to smooth the current and convert the smoothed current into a control voltage;

an oscillation circuit configured to generate a first sine-wave clock having a frequency corresponding to the control voltage and a second sine-wave clock having a phase obtained by shifting a phase of the first sine-wave clock by 90 degrees; and a clock selector configured to select, as the recovered clock, one of the first sine-wave clock and the second sine-wave clock, a selected clock having a first voltage difference between a voltage of the selected clock at a time of a transition of the data signal and a center of an amplitude of the selected clock being larger than a second voltage difference between a voltage of a non-selected clock at the time and a center of an amplitude of the non-selected clock.

6. The clock and data recovery circuit according to claim 5, wherein the recovered clock is recovered from the data signal and has a frequency that is half a data rate.

7. The clock and data recovery circuit according to claim 5, wherein when the data signal is not input to the clock and data recovery circuit, the clock and data recovery circuit is in an off-state, and when the data signal is input to the clock and data recovery circuit in the off-state, the clock and data recovery circuit returns to an operation state.

* * * * *